United States Patent
Satou et al.

(10) Patent No.: US 6,892,582 B1
(45) Date of Patent: May 17, 2005

(54) SEMICONDUCTOR PRESSURE SENSOR AND PRESSURE SENSING DEVICE

(75) Inventors: Shinya Satou, Hitachi (JP); Satoshi Shimada, Hitachi (JP); Atsuo Watanabe, Hitachiota (JP); Yasuo Onose, Toukai (JP); Seiji Kuryu, Hitachinaka (JP); Atsushi Miyazaki, Mito (JP); Junichi Horie, Hitachinaka (JP); Naohiro Momma, Hitachi (JP)

(73) Assignees: Hitachi, Ltd., Tokyo (JP); Hitachi Car Engineering Co., Ltd., Hitachinaka (JP)

( * ) Notice: Subject to any disclaimer, the term of this patent is extended or adjusted under 35 U.S.C. 154(b) by 0 days.

(21) Appl. No.: 09/936,480

(22) PCT Filed: Aug. 20, 1999

(86) PCT No.: PCT/JP99/04485
§ 371 (c)(1),
(2), (4) Date: Dec. 26, 2001

(87) PCT Pub. No.: WO01/14842
PCT Pub. Date: Mar. 1, 2001

(51) Int. Cl.[7] .............................................. G01L 7/08
(52) U.S. Cl. .......................... 73/715; 73/717; 73/723; 73/777; 361/283.1; 361/283.4
(58) Field of Search .................. 73/716, 720, 721, 73/754, 715, 717, 723, 777; 257/254, 417; 361/283.1, 283.4

(56) References Cited

U.S. PATENT DOCUMENTS

| 4,665,610 A | | 5/1987 | Barth |
| 5,544,529 A | * | 8/1996 | Mitani et al. .................. 73/716 |
| 6,388,279 B1 | * | 5/2002 | Sakai et al. .................. 257/254 |

FOREIGN PATENT DOCUMENTS

| EP | 0947816 | 10/1999 |
| JP | 8501156 | 2/1996 |
| JP | 09257618 | 10/1997 |
| JP | 10111195 | 4/1998 |
| JP | 10300610 | 11/1998 |
| JP | 1114482 | 1/1999 |
| JP | 11014482 | 1/1999 |
| JP | 11031825 | 2/1999 |
| WO | 94/17383 | 8/1994 |

\* cited by examiner

OTHER PUBLICATIONS

Search Report.

*Primary Examiner*—Andrew H. Hirshfeld
*Assistant Examiner*—Marissa Ferguson
(74) *Attorney, Agent, or Firm*—Crowell & Moring LLP (57) ABSTRACT

The object of the present invention is to propose an etch channel sealing structure characterized by excellent impermeability to moisture and resistance to temporal change of the diaphragm in the pressure sensor produced according to the sacrificial layer etching technique, and to provide a pressure sensor characterized by excellent productivity and durability. After a very small gap is formed by the sacrificial layer etching technique, silicon oxide film is deposited by the CVD technique or the like, thereby sealing the etch channel. Further, impermeable thin film of polysilicon or the like is formed to cover the oxide film.

This allows an etch channel sealing structure to be simplified in the pressure sensor produced according to the sacrificial layer etching technique, and prevents entry of moisture into the cavity, thereby improving moisture resistance. Moreover, sealing material with small film stress reduces temporal deformation of the diaphragm.

12 Claims, 12 Drawing Sheets

SEMICONDUCTOR PRESSURE SENSOR AND PRESSURE SENSING DEVICE

TECHNICAL FIELD

The present invention relates to a semiconductor sensor having a micro-cavity structure and an actuator created based on the sacrificial layer etching technique, and particularly to an electrostatic capacitance semiconductor pressure sensor.

BACKGROUND TECHNIQUE

Figure 23:
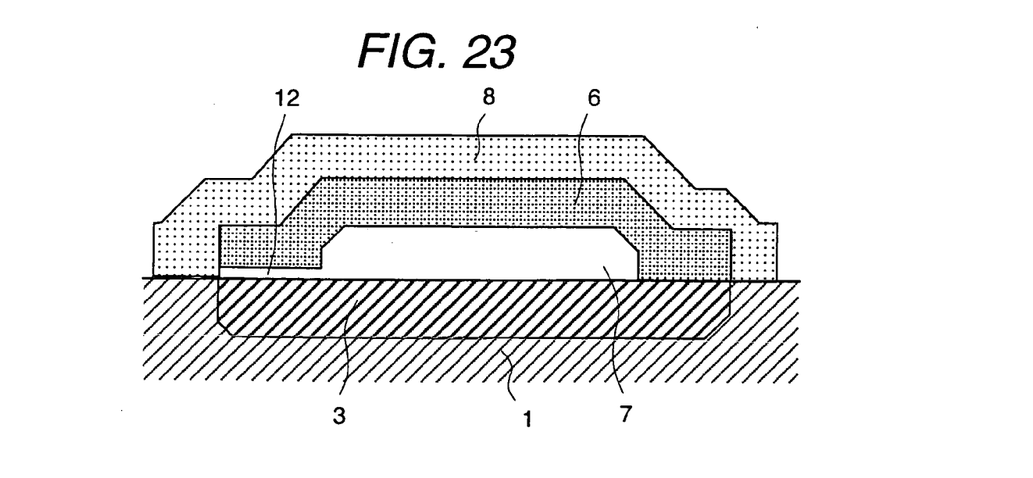
FIG. 23 is a cross sectional view representing the pressure sensor according to the prior art.

The prior art related to the present invention is disclosed in Japanese Application Patent Announcement Publication No. Hei 08-501156 as shown in FIG. 23, for example. This Patent describes the pressure sensor manufactured according to the sacrificial layer etching technique. Sacrificial layer etching is formed in the following process, for example: A sacrificial layer to be removed later is formed on the substrate in advance, and part of this layer is removed. A film remaining as a structure or anchor is formed thereon, and the end portion of the sacrificial layer is exposed to the outside. This portion is removed by etching, then a sensor and actuator are manufactured with the structural film. Or this process is repeated several times to form a more complicate structure. A fixed electrode 3 is formed on the surface of a silicon substrate 1 and a polysilicon diaphragm 6 is formed thereon, with a gap 7 located in-between. This gap 7 is formed by etching and removing the sacrificial layer already formed in this area through an etch channel 12 provided on part of polysilicon diaphragm 6. To close this etch channel 12 and to provide vacuum sealing of the gap 7, silicon oxide film 8 is formed to cover the whole surface of the polysilicon diaphragm 6 and part of the silicon substrate 1 are covered. As a result, gap 7 is formed as a vacuum sealed pressure reference chamber, and a capacitor is formed between the fixed electrode 3 provided on the substrate in the pressure reference chamber and a conductive diaphragm (movable electrode) consisting of the polysilicon film 6. If there is a change in the external pressure, polysilicon film is displaced by differential pressure from the pressure reference chamber and a gap is changed between the two electrodes to cause a change in the capacitance of the capacitor. This change in capacitance is used to detect the pressure.

Another prior art related to the present invention is disclosed in the Japanese Application Patent Laid-Open Publication No. Hei 11-14482. This Patent also refers to the capacitance pressure sensor manufactured according to the sacrificial layer etching technique. In this case, a silicon nitride film is used to seal the etch channel.

To ensure reliability in the long-term use of the pressure sensor of the above-mentioned structure, it is necessary to reinforce the hermetic structure of the pressure reference chamber and to prevent temporal change of the output. This requires careful selection of an adequate sealing structure of the etch channel and a proper sealing material. Japanese Application Patent Announcement Publication No. Hei 08-501156 discloses a silicon oxide film used as a sealing material. However, silicon oxide film is permeable to moisture to some extent. In a highly humid environment, therefore, moisture may enter the gap through oxide film, causing changes in characteristics.

If the etch channel is sealed by nitride silicon film as disclosed in Japanese Application Patent Laid-Open Publication No. Hei 11-14482, characteristics of such a structure as diaphragm will be changed with time since silicon nitride film has a very great film stress after film formation. Accordingly, prevention of deformation requires reduction in the thickness of silicon nitride film used for sealing. This will result in restrictions on the size of the etch channel, etching failure of the sacrificial layer or increased etching time.

DISCLOSURE OF INVENTION

The present invention is intended to solve above-mentioned problems. Its object is to propose an etch channel sealing structure highly resistant to moisture and temporal change of the diaphragm in the pressure sensor produced according to the sacrificial layer etching technique, and to provide a pressure sensor characterized by excellent productivity and durability.

BEST FORM OF EMBODIMENT OF THE INVENTION

Figure 1:
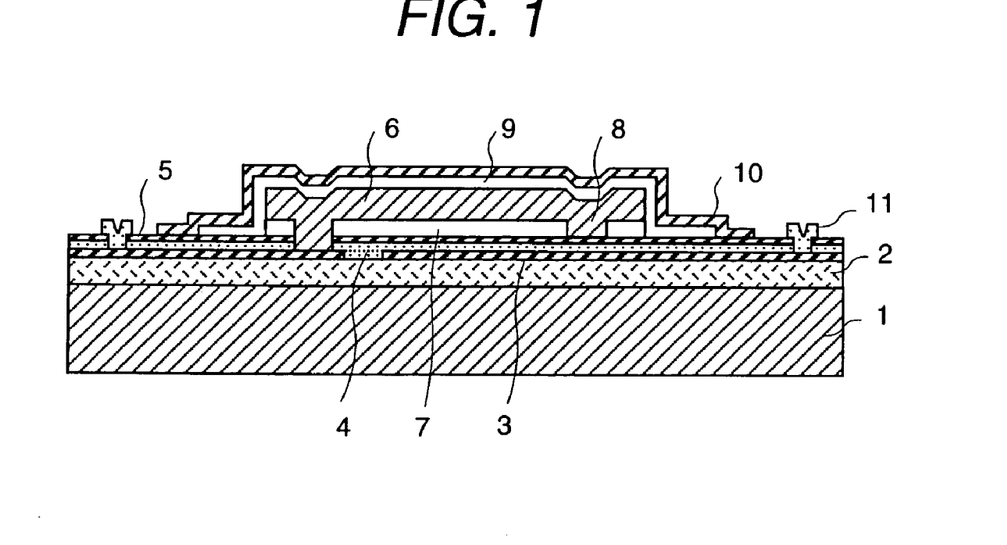
FIG. 1 is a cross sectional view representing a first embodiment of the present invention.
Figure 2:
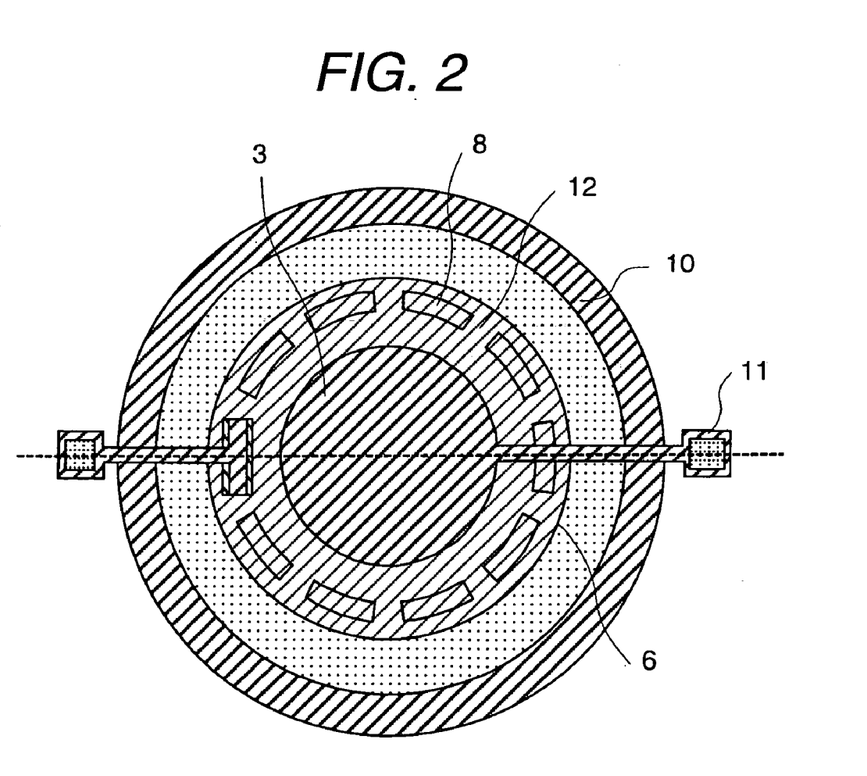
FIG. 2 is a plan view representing a first embodiment of the present invention.
Figure 3:
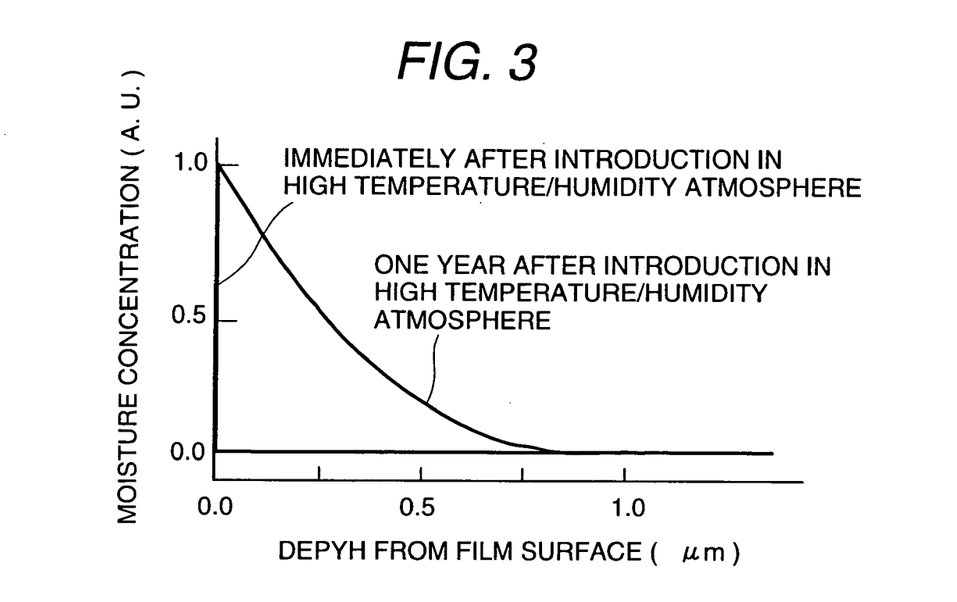
FIG. 3 is a drawing representing how moisture passes through silicon oxide film.

The following provides a detailed description of the present invention with reference to the embodiments given in the drawings: FIG. 1 is a cross sectional view representing an embodiment of a semiconductor pressure sensor according to the present invention, and FIG. 2 is a plan view thereof. The following describes the structure with reference to FIGS. 1 and 2. Monocrystal silicon substrate 1 is used for the substrate, and silicon oxide film 2 is formed on the surface thereof as an insulation layer. A fixed electrode 3 is formed on the silicon oxide film 2, and is made of polysilicon with phosphorus or other impurities dispersed thereon. Silicon oxide film 4 is formed on fixed electrode 3, and silicon nitride film 5 is formed on the surface thereof in order to protect the substrate surface in the sacrificial layer etching process to be discussed later and to avoid leak current on the substrate surface. Polysilicon diaphragm 6 with part of its periphery fixed on the silicon nitride film 5 is formed on the top of the silicon nitride film 5, and a very small space 7 surrounded by the diaphragm and substrate is formed. The diaphragm substrate fixed portion 8 is annular but is fragmented at an equally spaced interval. The fragmented portion serves as an etch channel 12 leading to the gap. The etch channel is a serves as a path for etchant to enter the gap at the time of etching of the sacrificial layer to be discussed later. In order to close this etch channel 12 and to vacuum-seal the gap, the substrate portion close to the circumference of polysilicon diaphragm 6 and the surface of the outer wall of the polysilicon diaphragm 6 are covered with silicon oxide film 9 used for sealing. This sealing material is required to meet the following conditions: Since it must cover the substrate and movable electrode at the same time, it must be insulated to prevent leak current flowing between them. Secondly, since it covers the side wall of the diaphragm, it must provide an excellent step coverage and sealing material must not enter the inside of the gap. Thirdly, it must be of compact film in order to maintain hermeticity for a long time. Lastly, film can be formed in a short time. As a material meeting almost all of these conditions, silicon oxide film 9 formed by the CVD (chemical vapor deposition) method is adopted in the present embodiment. As shown in FIG. 3, however, the defect of sealing by silicon oxide film 9 is that, when exposed to the environment of high temperature and high humidity for a long time, moisture may enter the gap through silicon oxide film and may change the output characteristics. To eliminate this possibility in the present embodiment, an impermeable polysilicon film 10 having a diffusion coefficient of water of $1 \times 10^{-6}$ (m$^2$/s) or less is formed on the surface of the silicon oxide film 9, thereby preventing moisture from permeating the silicon oxide film 9. This polysilicon film 10 is fixed to the ground potential made conductive by diffusion of phosphorus and other impurities, and serves as a shield against electrostatic discharge to prevent ion particle and other external electrical charge from affecting the measurement of capacity.

The following describes the principle of operations with reference to FIG. 1: The silicon diaphragm 6 serves as a movable electrode, and forms a capacitor between it and fixed electrode 3, with a very small gap located in-between.

The interior of the gap is a vacuum pressure reference chamber, and the silicon diaphragm 6 is deflected due to differential pressure between the pressure reference chamber and the outside. The electrode gap of the capacitor is changed by the deflection of the silicon diaphragm 6 in response to the external pressure, and the capacitance of the capacitor is subjected to changes. This change in capacitance is detected as a change in voltage by the switched capacitor circuit, diode bridge circuit or the like.

Figure 4:
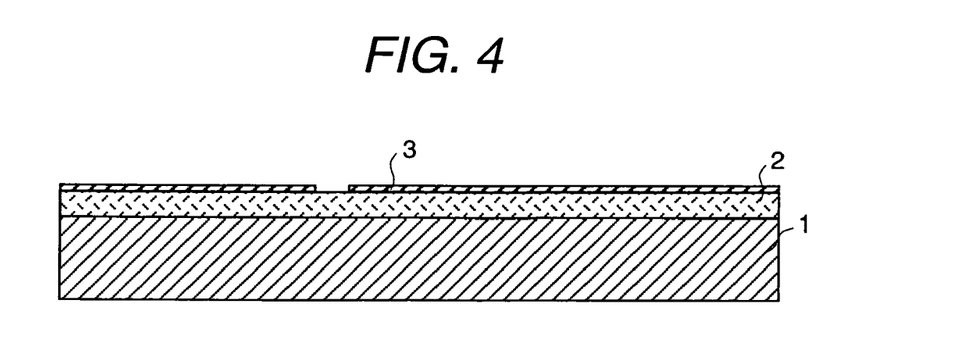
FIG. 4 is a drawing representing part of the production process in the first embodiment of the present invention.
Figure 5:
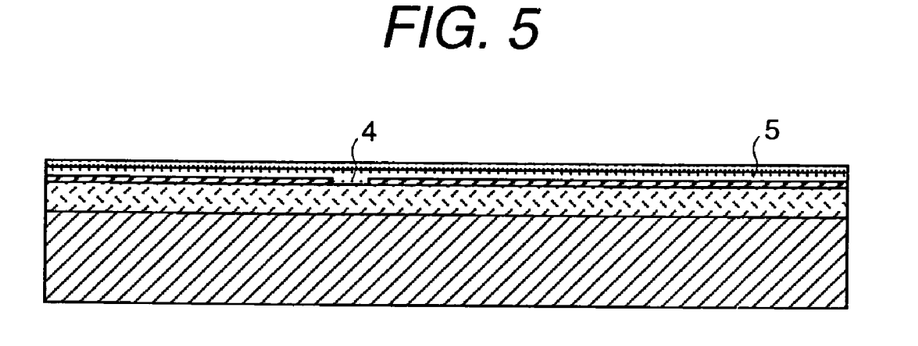
FIG. 5 is a drawing representing part of the production process in the first embodiment of the present invention.
Figure 6:
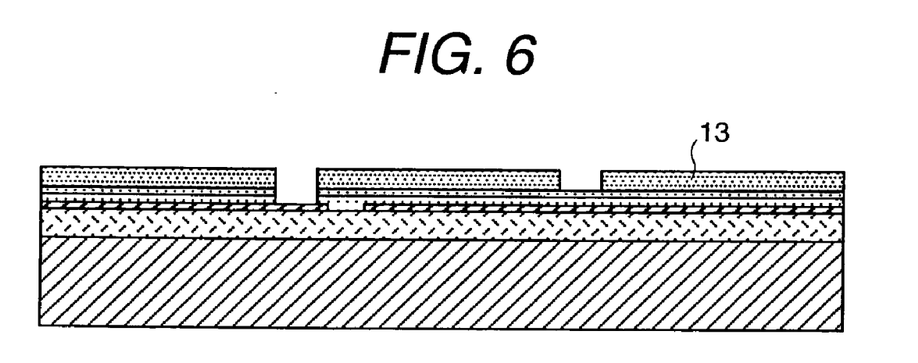
FIG. 6 is a drawing representing part of the production process in the first embodiment of the present invention.
Figure 7:
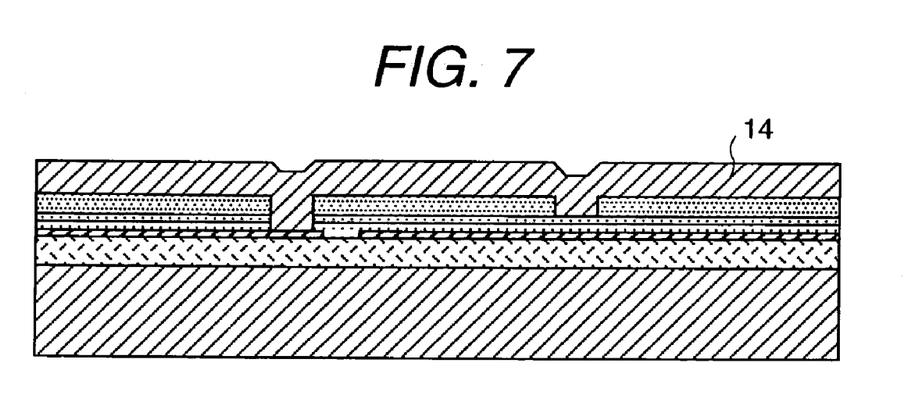
FIG. 7 is a drawing representing part of the production process in the first embodiment of the present invention.
Figure 8:
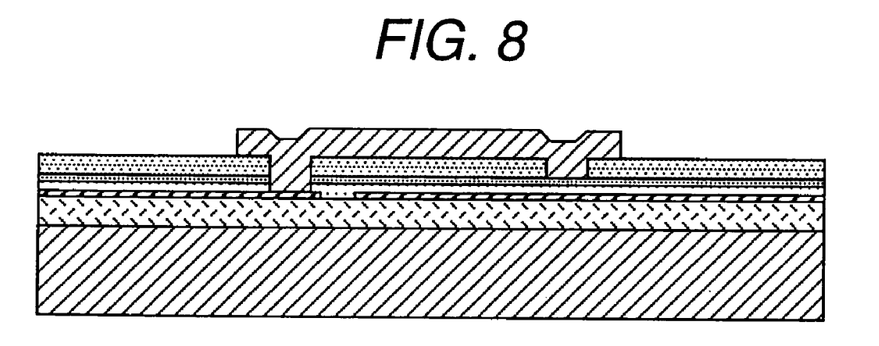
FIG. 8 is a drawing representing part of the production process in the first embodiment of the present invention.

The following describes the production method: The production process for this sensor is based on LSI production process. Firstly, as shown in FIG. 4, the monocrystal silicon substrate 1 is subjected to thermal oxidation, and a silicon oxide film 2 serving as an insulating layer is formed on the top surface of the substrate. Then polysilicon film is formed on the surface thereof by CVD method and phosphorus and other impurities are dispersed to make it electrically conductive. Then a desired form of fixed electrode 3 is obtained by the photo etching technique. Then as shown in FIG. 5, silicon oxide film 4 and silicon nitride film 5 are formed as barrier layers on the surface of the substrate according to the CVD method. After that, a sacrificial layer 13 consisting of phosphate glass (PSG) is formed according to the CVD method, as shown in FIG. 6. The thickness of this sacrificial layer is equal to the height of a desired gap (electrode gap) to be formed later. This sacrificial layer 13 is processed by photo etching technique and desired forms of the gap 7, diaphragm substrate fixed portion 8 and etch channel 12 are obtained in one operation. As shown in FIG. 7, polysilicon film 14 is formed by the CVD method to the sacrificial layer 13, and is made electrically conductive with phosphorus or other impurities dispersed thereon. Then it is processed by photo etching technique to get a desired form of diaphragm 6, as shown in FIG. 8. Here part of the sacrificial layer 13 is exposed to the outside from the etch channel.

Figure 9:
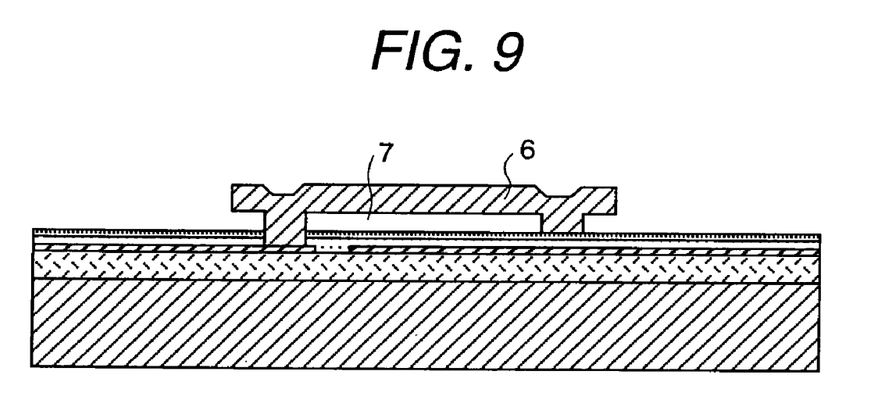
FIG. 9 is a drawing representing part of the production process in the first embodiment of the present invention.
Figure 10:
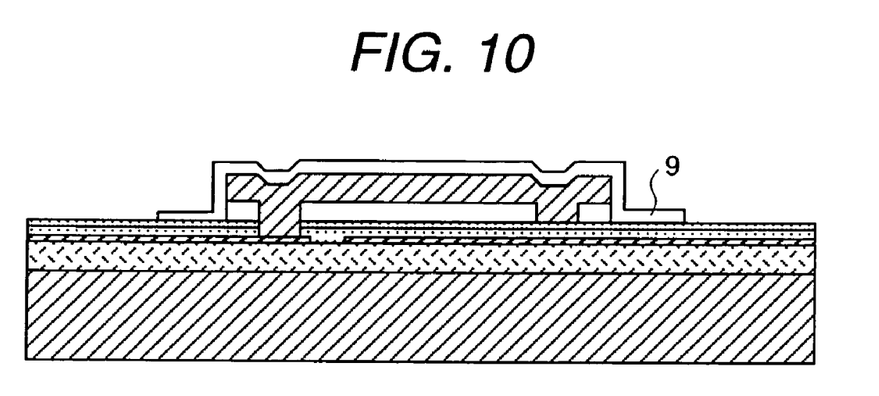
FIG. 10 is a drawing representing part of the production process in the first embodiment of the present invention.
Figure 11:
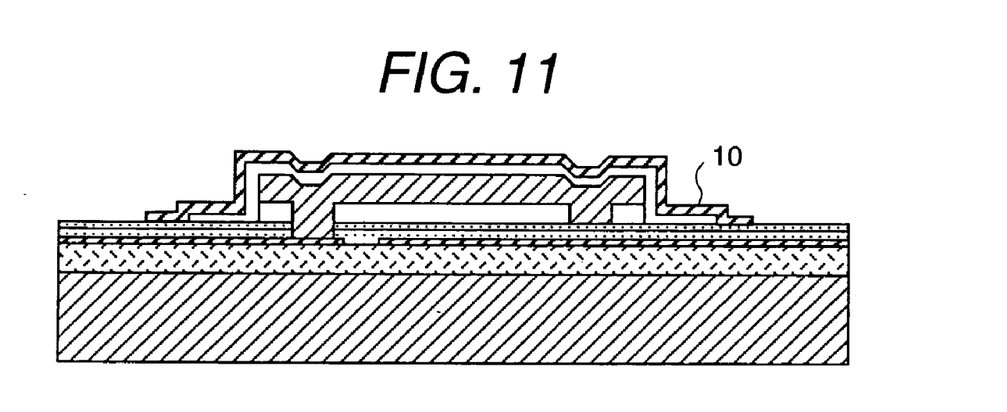
FIG. 11 is a drawing representing part of the production process in the first embodiment of the present invention.
Figure 12:
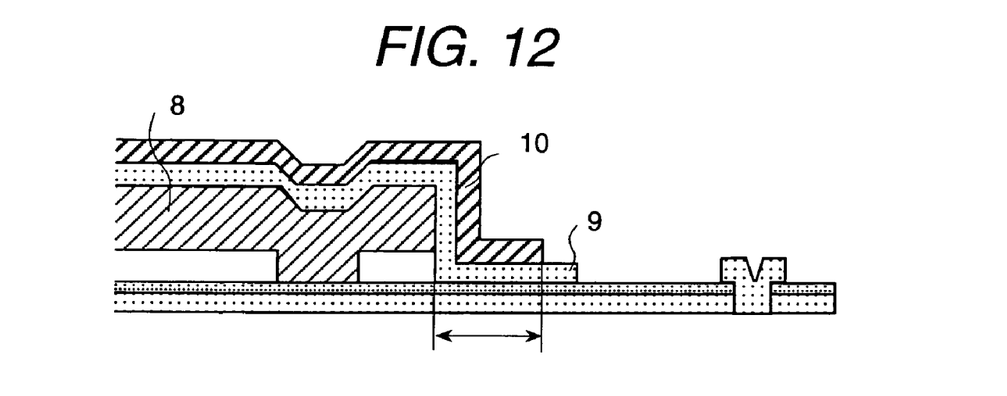
FIG. 12 is a drawing representing part of the production process in the first embodiment of the present invention.
Figure 13:
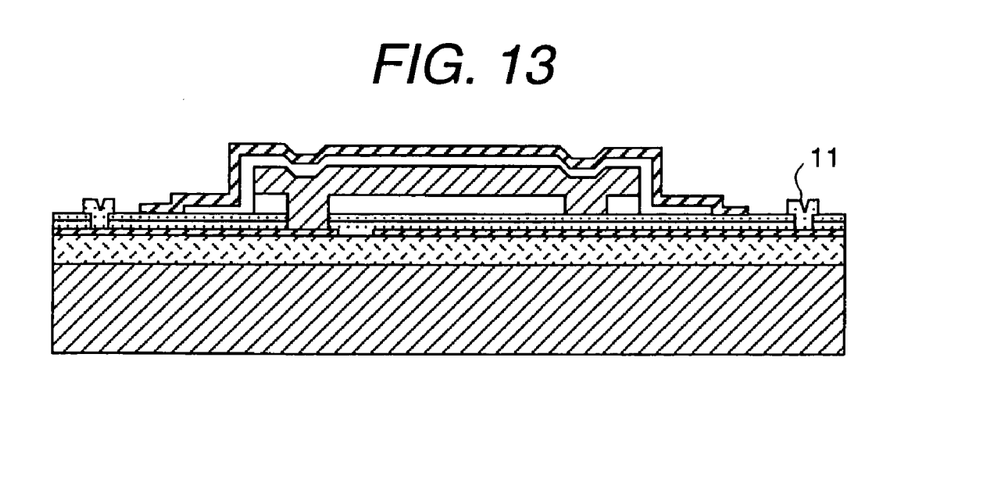
FIG. 13 is a drawing representing part of the production process in the first embodiment of the present invention.

When this substrate is immersed in HF based etchant, only the sacrificial layer 13 is removed through the etch channel 12 as shown in FIG. 9, and a very small gap 7 is formed sandwiched between the substrate and polysilicon film 6. Then as shown in FIG. 10, the silicon oxide film 9 is formed according to the CVD method to cover the substrate and polysilicon film 6, and is processed into a desired form by the photo etching technique. Since the gap is formed almost under vacuum, it serves as a pressure reference chamber when it is vacuum-sealed and used as an absolute pressure sensor. After that, polysilicon film 10 is formed on the oxide film 9 as surface protective film by the CVD method, as shown in FIG. 11, and is processed into a desired form by the photo etching technique. It is preferred cover the sealed oxide film 9 entirely with the polysilicon film 10 from the moisture-proof surface, as shown in FIG. 11. However, there is no need of covering it entirely as shown in FIG. 12, if the distance from the end of the polysilicon film 10 to the etch channel 12 is sufficiently long, based on the relationship between the thickness of the silicon oxide film and permeation of water shown in FIG. 3, when consideration is given to the service life and permeation speed of moisture in the oxide film. In the present embodiment, the distance from the end of the polysilicon film 10 to the etch channel 12 is set to 10 microns. This is intended to ensure a durability of 10 years because the permeation speed of moisture is 1 microns per year according to our examination. Further, silicon nitride film can be considered as impermeable film, but silicon nitride film has a very large film stress of about 1.5 GPa. This will cause temporal deformation of the polysilicon diaphragm 6. To avoid deformation, film thickness is set to 0.4 microns or less in this embodiment. Further, to prevent pinholes from occurring, film thickness is preferred to be 0.1 micros or more. Lastly, as shown in FIG. 13, a contact hole is opened by etching of silicon nitride film 5 and silicon oxide film 4, and photo etching is performed after sputtering of aluminum. This process provides an aluminum lead 11 of fixed electrode 3 and polysilicon movable electrode 6.

The structure discussed above is characterized in that a combination of silicon oxide film manufactured by the CVD method and polysilicon film is used as a sealing material of etch channel. This simplifies the sealing structure and improves the resistance to moisture. Further, residual stresses of the oxide film and polysilicon film subsequent to formation of film are as small as about 0.15 GPa and 0.2 GPa, respectively. This reduces the temporal deformation of the diaphragm.

Figure 14:
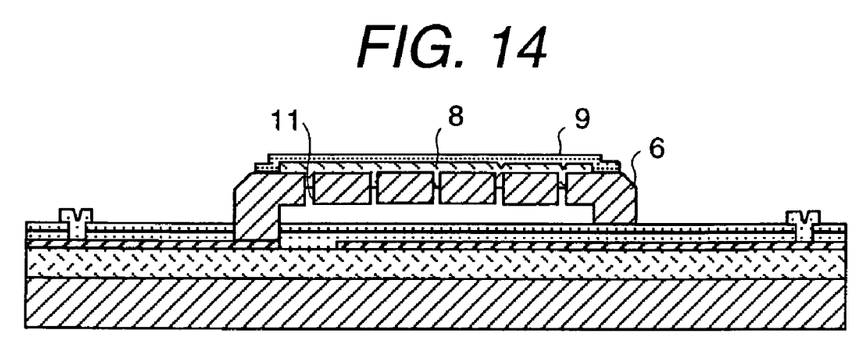
FIG. 14 is a cross sectional view representing a second embodiment of the present invention.
Figure 15:
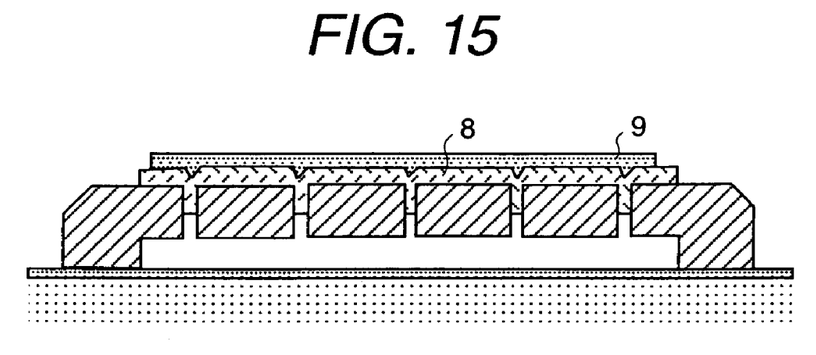
FIG. 15 is a drawing representing changes in the form of polysilicon film for surface protection in the second embodiment.

The following describes another embodiment according to the present invention. FIG. 14 is a cross sectional view representing one embodiment of a semiconductor pressure sensor according to the present invention. In this structure, a hole is created on the top surface of the diaphragm 6. This hole is used as an etch channel 12, and a sacrificial layer is removed to create a pressure reference chamber. Polysilicon and silicon oxide film can be considered as a sealing material for the etch channel 12. In the case of polysilicon, the polysilicon having passed through the hole by the time hole sealing is completed is deposited on the fixed electrode to form a column, with the result that a desired gap structure cannot be obtained. To solve this problem, the present embodiment adopts silicon oxide film 9 as a sealing material. When oxide film formed by the CVD method is used, a short time is required for sealing because of a great amount of deposit on the side face of the hole, resulting in a reduced amount of deposit on the fixed electrode. As described above, however, if oxide film alone is used for sealing, moisture may permeate oxide film in the environment of high humidity to enter the gap, and may cause changes in characteristics. To solve this problem, the whole surface on oxide film is covered with polysilicon 10, similarly to the above-mentioned embodiment, or part of the oxide film is covered to ensure that the distance between the above-mentioned etch channel 9 and polysilicon 10 exceeds a certain value, with consideration given to service life and permeation speed of moisture in silicon oxide film, as shown in FIG. 15.

Figure 16:
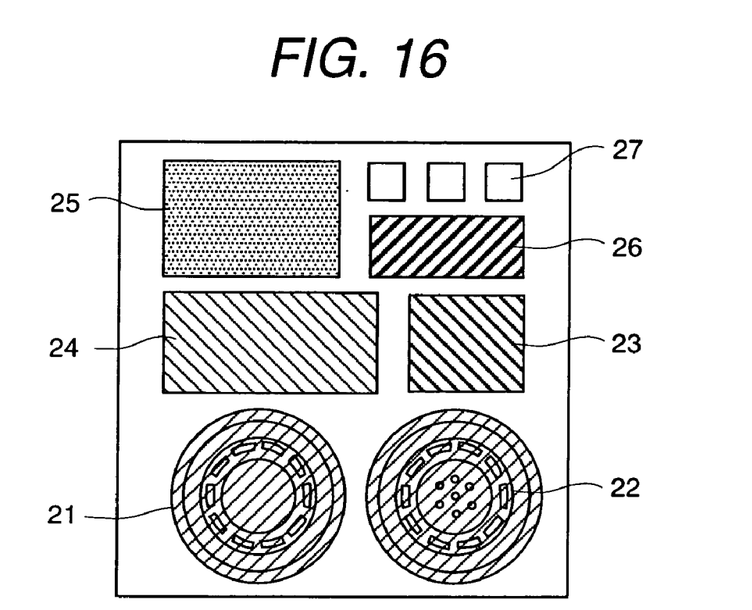
FIG. 16 is a plan view representing a third embodiment of the present invention.
Figure 17:
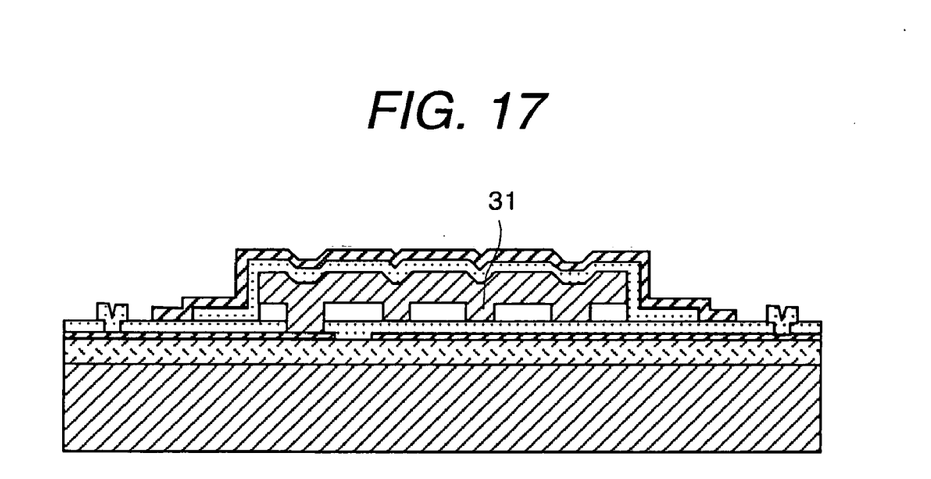
FIG. 17 is a cross sectional view representing a reference capacitor in the third embodiment.

With reference to FIG. 16, the following describes the embodiment of the circuit integrated type pressure sensor where a signal processing circuit is integrated onto the pressure sensor according to the present invention. The pressure gage is manufactured according to the IC production process. This makes it easy to manufacture a capacitance/voltage conversion circuit consisting of the CMOS on the same substrate. This sensor comprises a capacitor 21 for pressure detection, capacitor 22 for reference, oscillator 23, capacitance detecting circuit 24, computing circuit 25 for output adjustment, amplifier 26 and electrode pad 27. FIG. 17 illustrates the structure of the capacitor 22 for reference. The structure of the capacitor 22 for reference is almost the same as that of the capacitor 23 for pressure detection. However, a columnar substrate fixed portion 31 is arranged within the range of the diaphragm, and the diaphragm is fragmented. The capacitance is about the same as that of the capacitor for pressure detection, and capacitance value is hardly changed by pressure. So it serves as a reference capacitance in the process of detecting the capacitance to be discussed later. A MOS capacitor generally used as a circuit constituting component can be used as this capacitor 22 for reference. In the present embodiment, down sizing and cost cutting of the pressure sensor are achieved by integration of a pressure gage and detecting circuit. Further, a substantial improvement of measurement accuracy in capacitance detection can be realized due to reduced wiring capacitance between the capacitor and circuit.

Figure 18:
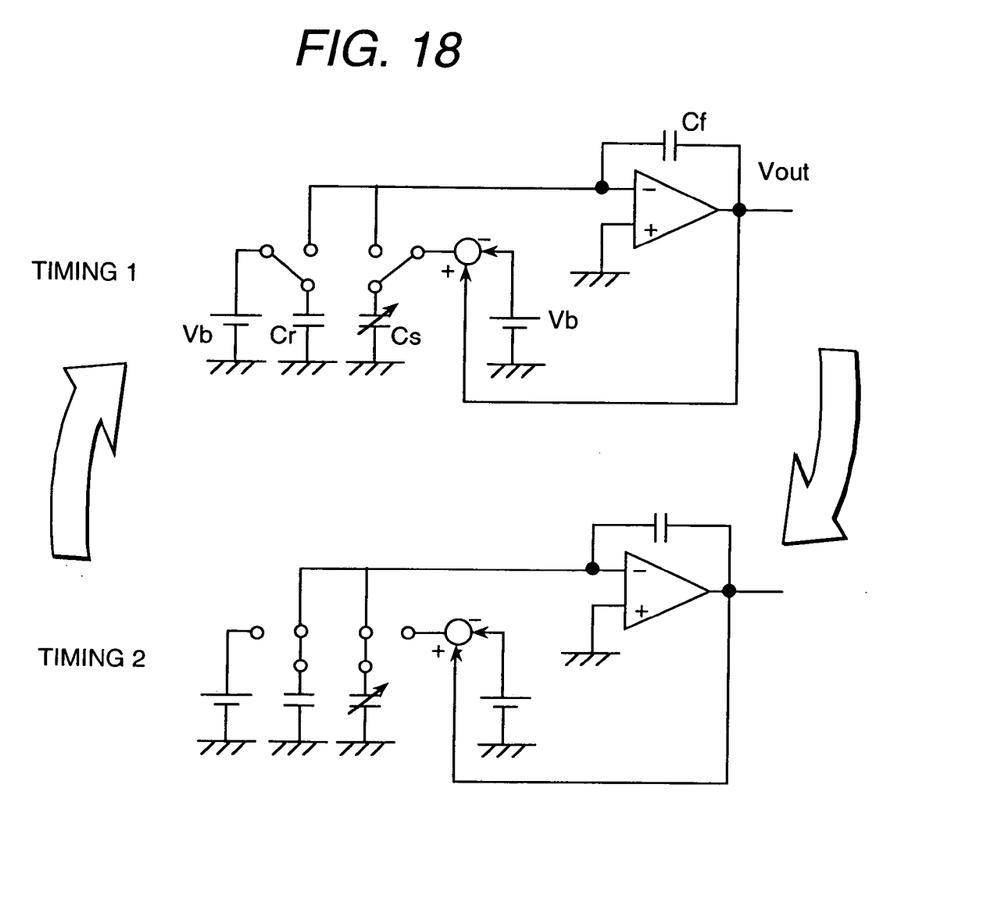
FIG. 18 is a circuit diagram representing a capacity detecting circuit in the third embodiment.

FIG. 18 illustrates a capacitance detecting circuit based on the principle of switched capacitance. The capacitor for pressure detection and capacitor for reference (capacitance values are assumed as Cs and Cr, respectively) are each connected with selector switches, and the states of timing 1 and timing 2 alternate. In the state of timing 1, the capacitor for reference and capacitor for pressure detection each are voltage sources, and the electric charge in conformity to capacitance value is stored. In the state of timing 2, both of them are connected to the input of the operational amplifier on the negative side. Electrical charges stored in the capacitor for reference and capacitor for pressure detection cancel each other, and the differential electrical charge flows into the operational amplifier. The electrical charge flowing into the operational amplifier charges the integral capacitor Cf to change the output voltage. Then when the state is shifted back to the state of timing 1, output voltage is connected to the capacitor for pressure detection to form a feedback loop. Since a negative feedback loop is formed, the amount of electrical charge in the capacitor for pressure detection comes closer to that in the capacitor for reference every time timing 1 and timing 2 are switched. They are kept in balance in the final stage, with the result that stable output voltage is ensured. Output voltage Vout at this time can be expressed as follows if the reference voltage is Vb:

$$Vout=(1-Cr/Cs)*Vb$$

1/Cs exhibits almost a linear decrease with respect to applied pressure. So Vout shows almost a linear increase with respect to applied pressure.

Figure 19:
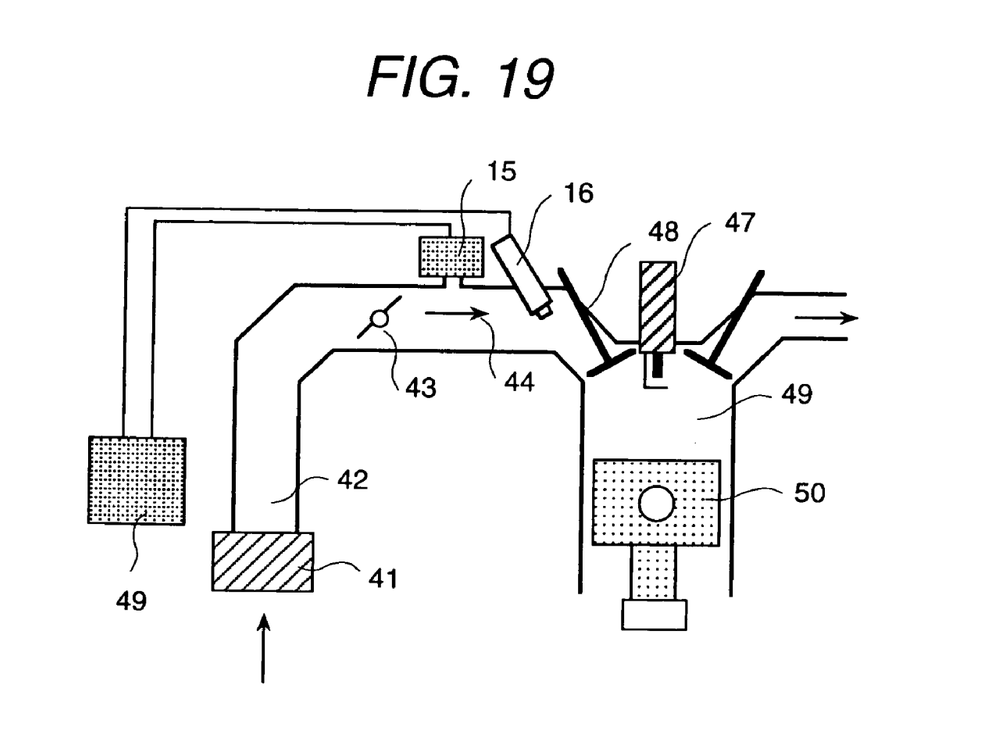
FIG. 19 is a drawing representing the car engine control system using a semiconductor pressure sensor according to the present invention.

FIG. 19 illustrates a the pressure sensor manufactured according to the present invention used as an intake pressure sensor of car engine control system: After passing through an air cleaner 41, outside air is led into the intake tube 42, and flow rate is adjusted by a throttle valve 43. Then the air is led into an intake manifold 44. A pressure sensor 45 according to the present invention is installed in the intake manifold to detect the pressure inside the intake manifold 4. Based on the signals of this pressure sensor 45 and engine speed, an engine controller unit 49 calculates the amount of intake. It calculates the amount of fuel to be injected best suited to the amount of intake, and the calculated amount of fuel is sent to the injector 46. Gasoline injected from the injector 46 is mixed with intake air to become gas mixture. It is fed into the combustion chamber when the intake valve 48 opens, and is compressed by a piston 50. Then it is exploded and burnt by a spark plug 47.

When the pressure sensor is used for a car engine control system as in the present embodiment, the hermetic structure of the pressure reference chamber is required to be very strong when consideration is given to the fact that the engine room where the pressure sensor is installed has a high temperature, the sensor is used in the highly humid environment as in the rain and the service life of the car is as long as about ten years. The air-tight sealed structure according to the present invention is excellent in resistance to humidity, and sufficiently meets the above conditions.

Figure 20:
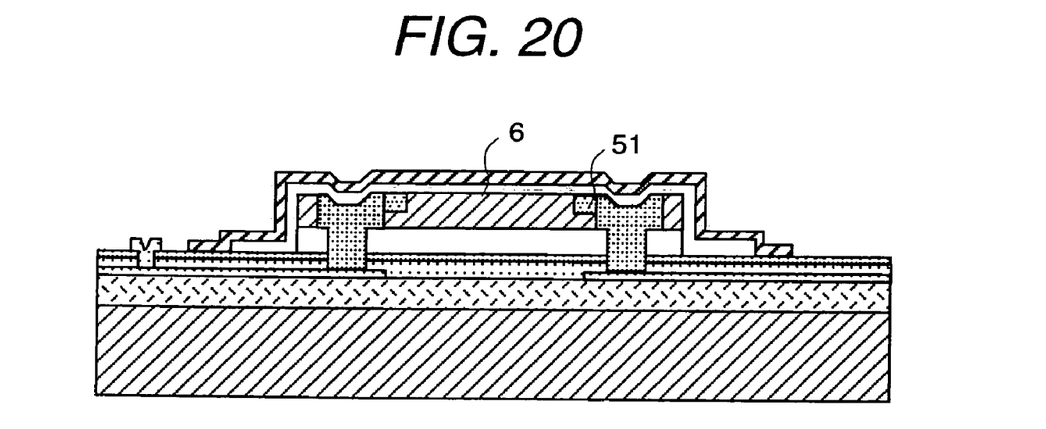
FIG. 20 is a cross sectional view representing a fourth embodiment of the present invention.
Figure 21:
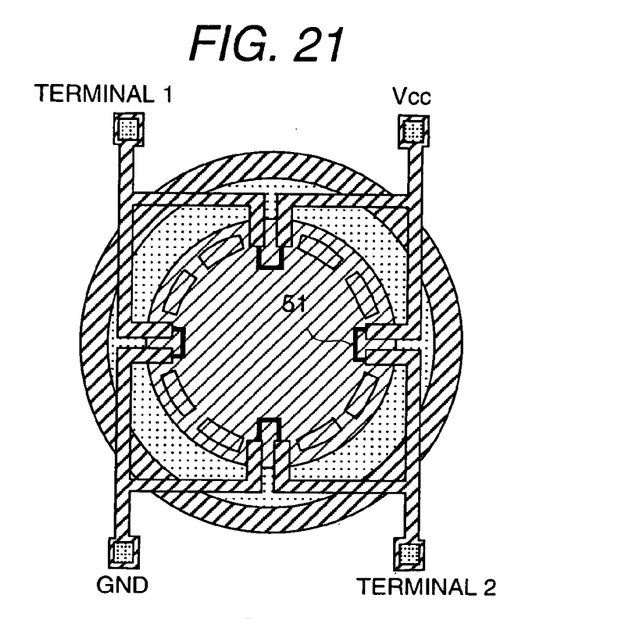
FIG. 21 is a plan view representing a fourth embodiment of the present invention.

The following describes an example where a very small gap structure produced based on the present invention is applied to a piezoresistive pressure sensor. FIG. 20 illustrates a cross sectional view and FIG. 21 shows a plan view. When phosphorus or other impurities are dispersed on the top surface of the polysilicon 6, a strain gage 51 is formed on the periphery of the diaphragm in a bridge shape. When voltage is applied to the bridge circuit and pressure is applied to the diaphragm 6, the diaphragm is bent and a change occurs to the resistance of the strain gage. A differential voltage occurs according to the pressure between two output terminals of the bridge. The pressure can be measured by amplifying and reading this differential voltage. When this sensor is used as an absolute pressure sensor, a very small gap structure must be vacuum-sealed. A sensor excellent in durability can be provided by the sealed structure formed by a combination of silicon oxide film 9 formed by the above-mentioned CVD method and polysilicon film 10.

Figure 22:
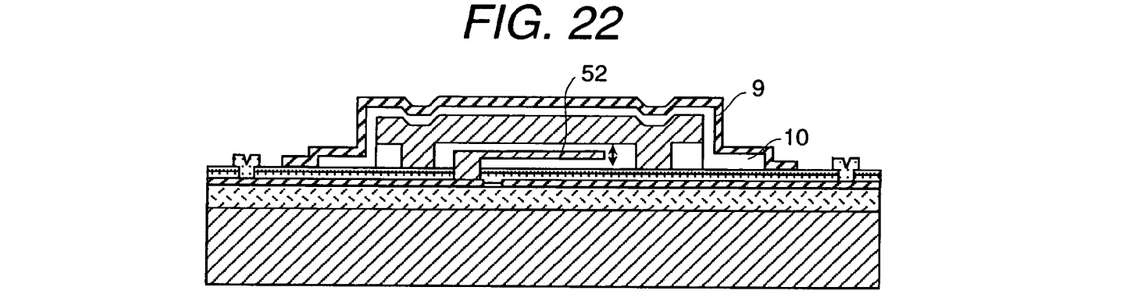
FIG. 22 is a plan view representing a fifth embodiment of the present invention.

The following describes the case where a very small gap structure produced according to the present invention is applied to the capacitance type acceleration sensor: FIG. 22 is a cross sectional view of the acceleration sensor where an overhang type beam 52 for acceleration detection is installed inside a vacuum-sealed very small gap. The overhang type beam is a movable electrode. If the overhang type beam is deformed by acceleration, there is a change in the gap with the fixed electrode installed on the substrate in a face-to-face position. This permits the acceleration to be detected as a change in capacitance. To increase the response, the interior of the gap must be vacuum-sealed. A sealed structure formed by a combination of the silicon oxide film 9 according to the CVD method and polysilicon film 10 is effective.

Additionally, the sealing structure of the etch channel according to the present invention finds application in a semiconductor vibration gyro having a vacuum sealed cavity, rotating gyro and infrared sensor.

Figure 24:
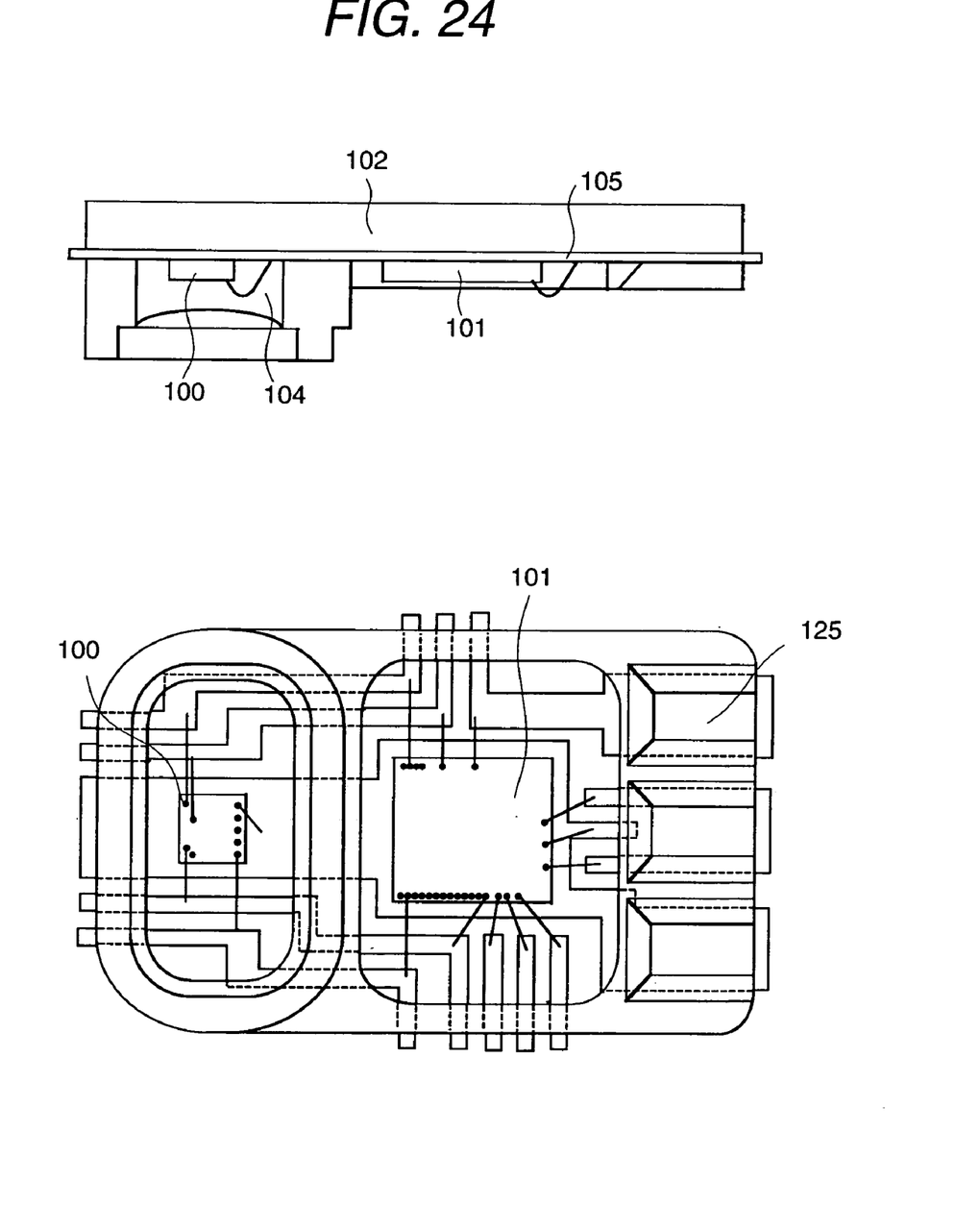
FIG. 24 illustrates a pressure detector according to the present invention.
Figure 25:
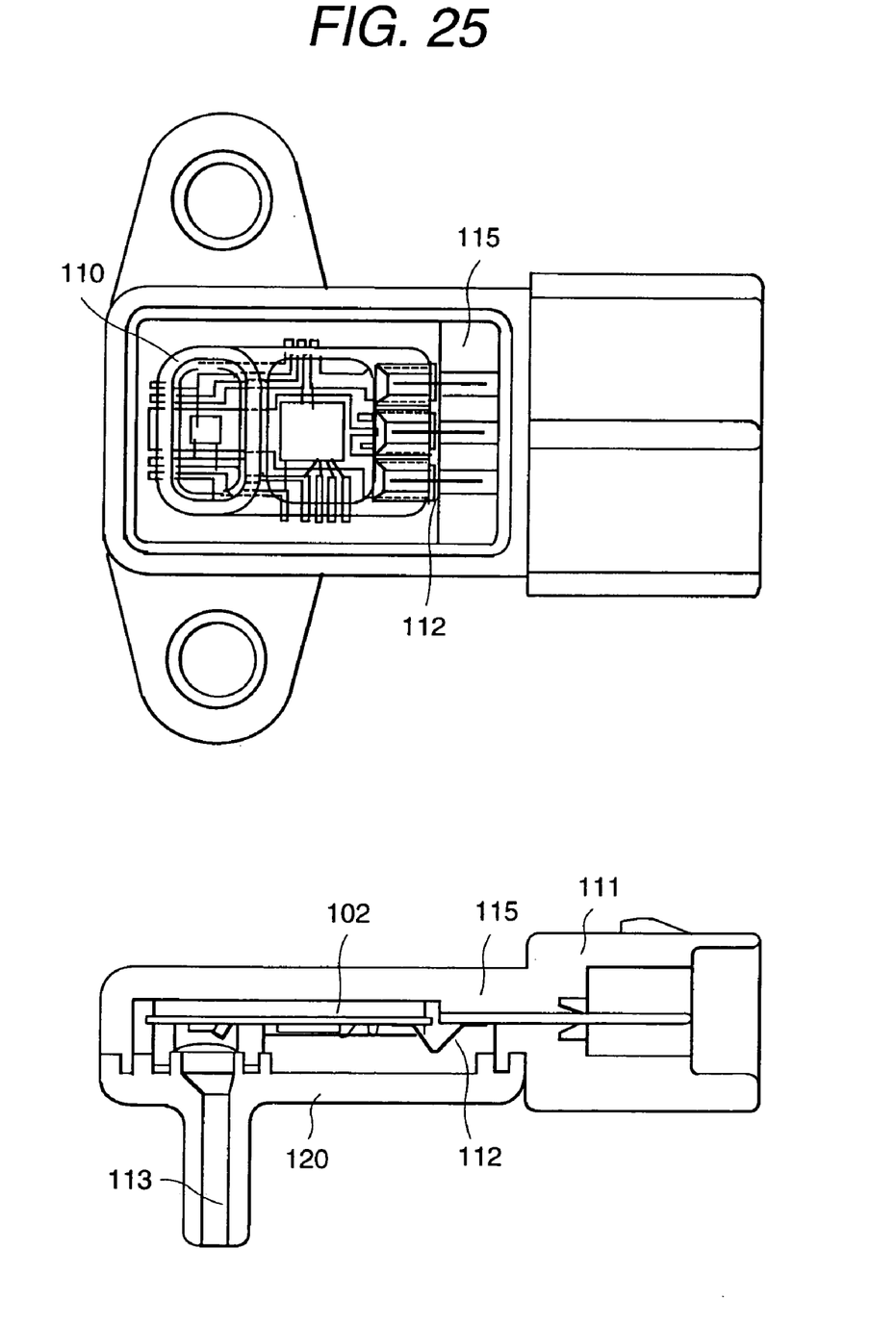
FIG. 25 illustrates a pressure detector according to the present invention.

The following describes the packaging of the pressure sensor according to the present invention with reference to FIGS. 23 and 24. There are following types to get the specified pressure value; a chip (gage chip) type sensor consisting of the capacitor for pressure detection and capacitance detecting circuit as described above, a 2-chip type sensor combined with a circuit chip to correct the output value, and a 1-chip type sensor with a correction circuit built in the gage chip. The following description takes up the example of a 2-chip type sensor: The gage chip 100 and circuit chip 101 is bonded on the lead frame comprising conductive metal formed on the resin-made sub-package 102 using the adhesive; further, each electrode pad 125 on the chip and each lead frame 105 are electrically connected by wire bonding. The circuit chip 101 can be sealed by the cover 120 to be discussed later. For the measurement of atmospheric pressure, the gage chip 100 must be exposed to the atmosphere through the pressure intake tube to be described later. Depending on the environment for use, dust particle, gasoline and acid may be contained in the atmosphere. When the gage chip is exposed directly to the atmosphere, the chip may be damaged. To protect the chip against them, silicone gel 104 is applied on the surface of the gage chip 100. The sub-package 110 with the two chips bonded with each other is further bonded to the resin-made housing 115 having a connector 111 using adhesive and others. The connector 111 and circuit chip are electrically connected by aluminum wire 112. In the final stage, a cover 120 with resin-made pressure intake tube 113 is bonded to seal the circuit, and this process is now complete. Adjustment is made in the following steps: Firstly, pressure application test is conducted to measure the output voltage of the gage chip. Then corrections in conformity to the characteristics are stored in the ROM installed inside the circuit chip 101. The above steps allows the sensor output to be adjusted to the specified output voltage. In the above case, a sub-package is used in the present embodiment, but need not always be used. Furthermore, the 1-chip type sensor allows the packaging costs to be cut down; for example, it permits the number of terminals to be reduced. The output of the circuit chip is output to the external signal line through the connector.

The present embodiment uses a combination of the oxide film manufactured by the CVD method
and polysilicon film as an etch channel sealing material in a pressure sensor manufactured by the sacrificial layer etching technique. This allows an etch channel sealed structure to be simplified, and prevents entry of moisture into the cavity, thereby improving moisture resistance. Moreover, sealing material with small film stress reduces temporal deformation of the diaphragm.

What is claimed is:

1. A semiconductor pressure sensor, comprising:
    a substrate;
    a diaphragm arranged on said substrate, the diaphragm comprising an etch channel;
    a silicon oxide film covering said diaphragm and sealing said etch channel; and
    a polysilicon film with a first side covering part or all of said silicon oxide film and a second side exposed to an environment of the pressure sensor.

2. A semiconductor pressure sensor according to claim 1, wherein a distance of said covered part is at least 10 microns or less from said etch channel.

3. A semiconductor pressure sensor according to claim 1, wherein a thickness of said polysilicon film is 0.1 microns or more.

4. A semiconductor pressure sensor according to claim 1, wherein a thickness of said polysilicon film is 0.1 microns or more up to and including 0.4 microns.

5. A pressure detector, comprising:
    (a) a detector providing an output, the detector including as an integral unit;
    a substrate,
    a diaphragm arranged on said substrate, the diaphragm comprising an etch channel;
    a silicon oxide film covering said diaphragm and sealing said etch channel, and
    a polysilicon film with a first side covering part or all of said silicon oxide film and a second side exposed to an environment of the pressure sensor;
    (b) a correction circuit for correction of the output of said detector;
    (c) a package enclosing said correction circuit and said detector; and
    (d) an intake tube provided in said package, the intake tube being used for introducing external pressure to said detector.

6. A pressure detector according to claim 5, wherein a distance (h) of said covering part is at least 10 microns or less from said etch channel.

7. A pressure detector according to claim 5, wherein a thickness (i) of said polysilicon film is 0.1 microns or more.

8. A pressure detector according to claim 5, wherein a thickness (j) of said polysilicon film is 0.1 microns or more up to and including 0.4 microns.

9. A pressure detector according to claim 5 comprising:
(e) a sub-package further comprising said correction circuit and said detector as an integral unit, and having on a surface a pad connected to said correction circuit; and
(f) an output terminal removably connected to an external signal line and being used to send a signal from said correction circuit to the external signal line;
wherein said correction circuit and said detector are enclosed by said package after said pad and said output terminal are connected by a metal wire.

10. A semiconductor pressure sensor, comprising:
a substrate;
a diaphragm arranged on the substrate, a gap between the diaphragm and the substrate being formed by sacrificial layer etching using etch channels arranged about a periphery of the diaphragm;
a silicon oxide film arranged over the diaphragm in order to seal the etch channels; and
a polysilicon film covering at least a substantial portion of the silicon oxide film.

11. A semiconductor pressure sensor according to claim 10, wherein the polysilicon film has a first side covering at least a substantial portion of the oxide film and a second side exposed to an environment of the pressure sensor.

12. A semiconductor pressure sensor according to claim 11, wherein the pressure sensor is an electrostatic capacity or piezoresistive pressure sensor.

* * * * *